(12) United States Patent
Tav et al.

(10) Patent No.: US 11,782,068 B2
(45) Date of Patent: Oct. 10, 2023

(54) INDOOR INTRUSION DETECTION

(71) Applicant: International Business Machines Corporation, Armonk, NY (US)

(72) Inventors: Doga Tav, Fredericton (CA); Richard James McCarty, Austin, TX (US); Cesar Augusto Rodriguez Bravo, Alajuela (CR)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 17/343,730

(22) Filed: Jun. 9, 2021

(65) Prior Publication Data
US 2022/0397586 A1 Dec. 15, 2022

(51) Int. Cl.
*G01P 5/14* (2006.01)
*G08B 13/20* (2006.01)
*G01P 5/00* (2006.01)
*H05K 7/20* (2006.01)

(52) U.S. Cl.
CPC ............... *G01P 5/14* (2013.01); *G01P 5/001* (2013.01); *G08B 13/20* (2013.01); *H05K 7/20745* (2013.01)

(58) Field of Classification Search
CPC .... G01P 5/14; G01P 5/001; G01P 3/26; G01P 21/025; G08B 13/20; H05K 7/20745
USPC ........................................................ 340/544
See application file for complete search history.

(56) References Cited

U.S. PATENT DOCUMENTS

| 3,090,817 | A1 | 1/2012 | Fowler | |
|---|---|---|---|---|
| 10,193,695 | B1 | 1/2019 | Endress | |
| 10,462,184 | B1 | 10/2019 | Gu | |
| 10,628,961 | B2 | 4/2020 | Sundaresan | |
| 2014/0359313 | A1* | 12/2014 | Campbell | G06F 3/023 702/45 |
| 2016/0140822 | A1* | 5/2016 | Kurtz | G08B 17/10 340/628 |

FOREIGN PATENT DOCUMENTS

CN 205050281 U 2/2016

OTHER PUBLICATIONS

"Aerodynamic-shape optimization," GitHub, Jan. 24, 2020, 1 page. <https://github.com/nathanrooy/aerodynamic-shape-optimization>.
(Continued)

*Primary Examiner* — Omar Casillashernandez
(74) *Attorney, Agent, or Firm* — Grant M. McNeilly

(57) ABSTRACT

A computer-implemented method, a system, and a computer program product for detecting objects are disclosed. The method can include receiving, by a computer communicatively connected to a plurality of anemometers positioned throughout the space, first sensor data from the plurality of anemometers, creating a baseline profile of airflow in the space based on the first sensor data, and receiving second sensor data from the plurality of anemometers at a different time than the first sensor data. The method can include comparing the second sensor data with the first sensor data to determine first different data, rendering, in response to determining that the second sensor data is different from the first sensor data, a representation of the object using the first different data and first location data related to the first different data, and calculating a vector associated with the object using the first different data and the first location data.

20 Claims, 11 Drawing Sheets

(56) References Cited

OTHER PUBLICATIONS

"Aerodynamic-shape optimization-of-Savonius-wind-turbines-using-genetic-algorithm-" GitHub, Mar. 31, 2018, 1 page. <https://github.com/explorer2326/Aerodynamic-Shape-Optimization-of-Savonius-Wind-Turbines-using-Genetic-Algorithm>.
"DEFCON 19: Build your own Synthetic Aperture Radar," YouTube, posted Oct. 29, 2011 by Christiaan008, 1 page. <https://www.youtube.com/watch?v=MViVyocQhVw>.
"Intrusion Detection and Prevention Systems," The National Institute of Standards and Technology (NIST), accessed May 19, 2021, 20 pages. <https://tsapps.nist.gov/publication/get_pdf.cfm?pub_id=901146>.
"Intrusion Detection Systems and Subsystems: Technical Information for NRC Licensees," United States Nuclear Regulatory Commission, Mar. 2011, 208 pages. <https://cdn.facilityexecutive.com/wp-content/uploads/sr1959.pdf.
Anonymous, "A means to detect sensor data false injection attack," IP.com, Disclosure No. IPCOM000257224D, Jan. 23, 2019, 7 pages. <https://ip.com/IPCOM/000257224>.
Anonymous, "Dynamic Wi-Fi Intrusion Detection and Ameliorative Action Strategy," IP.com, Disclosure No. IPCOM000258079D, Apr. 5, 2019, 8 pages. <https://ip.com/IPCOM/000258079>.
Anonymous, "Machine Learning Algorithms for Smart Meter Diagnostics," IP.com, Disclosure No. IPCOM000242462D, Jul. 16, 2015, 53 pages. <https://ip.com/IPCOM/000242462>.
Bowling, "Audible Frequency Chirp Sonar with the Stellaris Launchpad," Vimeo, 2015, 3 pages. <https://vimeo.com/117110029>.
Gaudreau et al., "Physical Security Best Practices for the Protection of Risk-Significant Radioactive Material," United States Nuclear Regulatory Commission, May 2014, 159 pages.
Lazaridis, "Long Range (10mt) IR Beam Break Detector," PCB Heaven, Dec. 11, 2010, 18 pages. <http://bcbheaven.com/circuitpages/Long_Range_IR_Beam_Break_Detector/>.
Mell et al., "The NIST Definition of Cloud Computing," Recommendations of the National Institute of Standards and Technology, U.S. Department of Commerce, Special Publication 800-145, Sep. 2011, 7 pages.
Tackabury et al., "Anomaly Detection Based on Airflow Alerters," U.S. Appl. No. 16/918,677, filed Jul. 1, 2020.
Tackabury et al., "Anomaly Detection Based on Airflow Measurement," U.S. Appl. No. 16/918,655, filed Jul. 1, 2020.

* cited by examiner

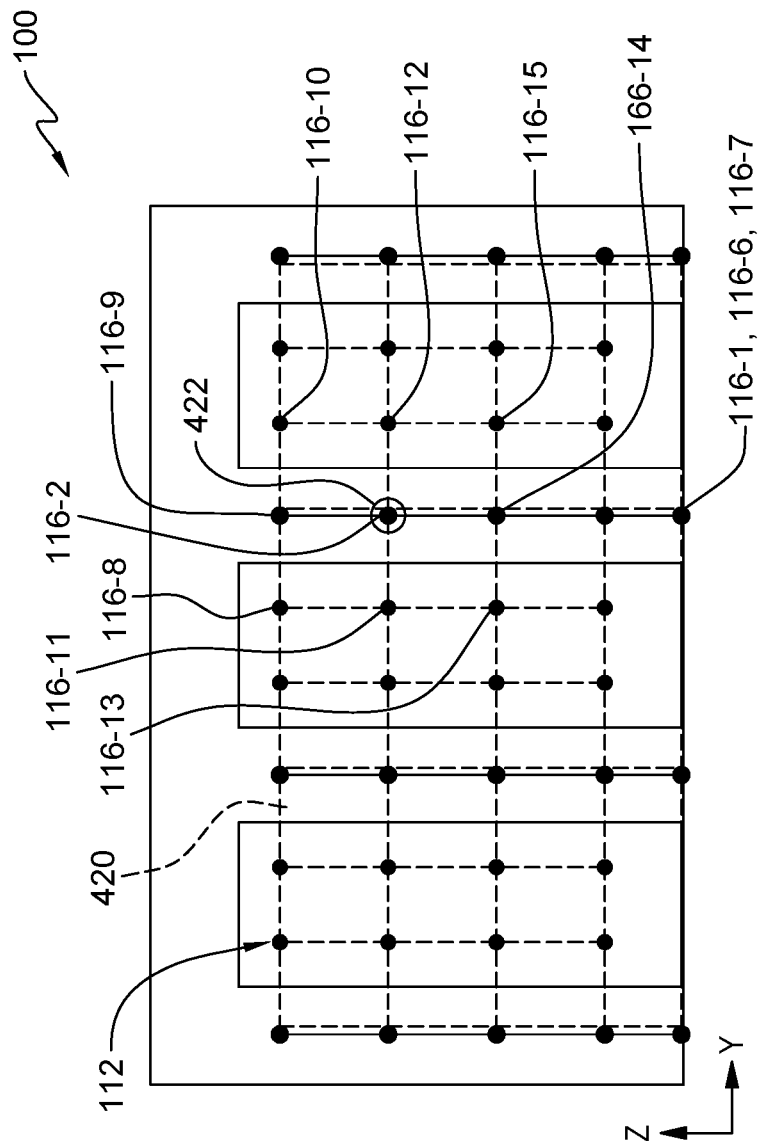

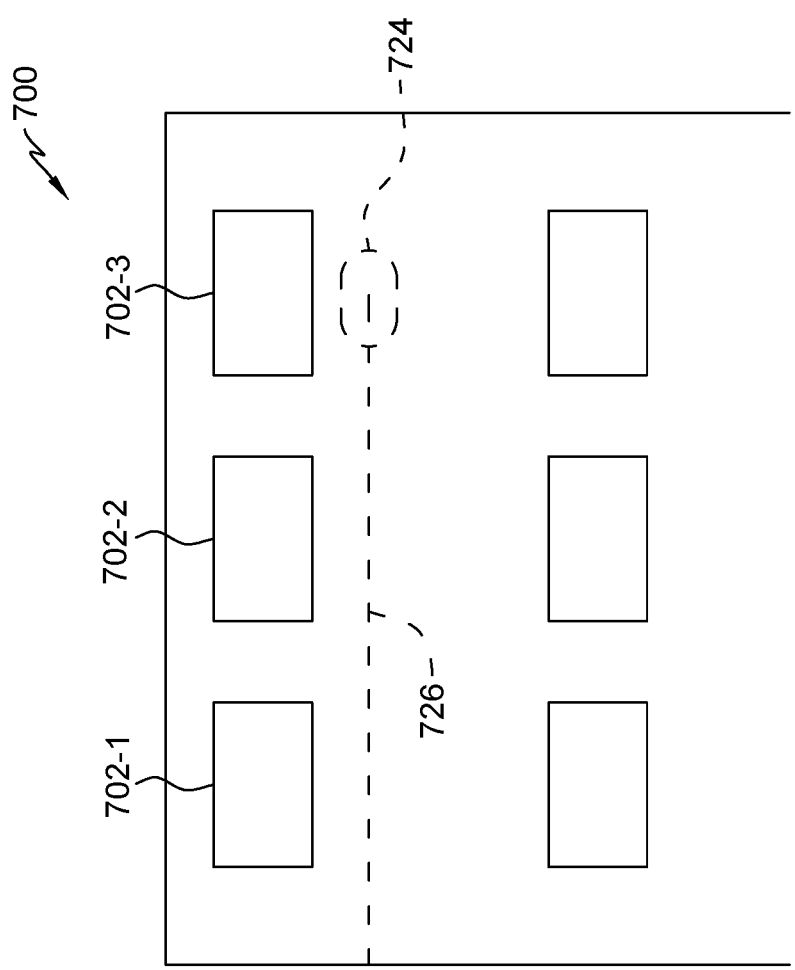

INDOOR INTRUSION DETECTION

BACKGROUND

The present disclosure relates to anomaly detection, and more specifically, to anomaly detection based on analysis of airflow measurements from a plurality of detectors.

Traditionally, high-value items located in buildings are protected by security measures, for example, to prevent unauthorized intruders from gaining access thereto. The nature of such items can vary widely (e.g., money, information, sensitive equipment, etc.), but one form of security can be control of physical access to buildings and/or specific areas of buildings (e.g., a room or a safe). These prohibited access regions can also be subject to video surveillance, although such systems often consume considerable amounts of electricity. In some emergency situations, electrical power may be limited in the building, for example, by the capacity of backup power supplies. In order to maintain the operability of more critical building systems, video surveillance security systems may be powered down to reduce power consumption, which can increase the vulnerability of the high-value items inside.

SUMMARY

A computer-implemented method, a system, and a computer program product for detecting an object within a space are disclosed. According to one embodiment, the method includes receiving, by a computer communicatively connected to a plurality of anemometers positioned throughout the space, first sensor data from the plurality of anemometers, creating a baseline profile of airflow in the space based on the first sensor data, and receiving second sensor data from the plurality of anemometers at a different time than the first sensor data. The method also includes comparing the second sensor data with the first sensor data to determine first different data, rendering, in response to determining that the second sensor data is different from the first sensor data, a representation of the object using the first different data and first location data related to the first different data, and calculating a vector associated with the object using the first different data and the first location data.

BRIEF DESCRIPTION OF THE DRAWINGS

FIG. 5 is a side view of the data center, in accordance with an embodiment of the present disclosure.

FIG. 8 is a top view of the data center showing a rendering of the tracking of the person in FIG. 6, in accordance with an embodiment of the present disclosure.

DETAILED DESCRIPTION

Figure 1:
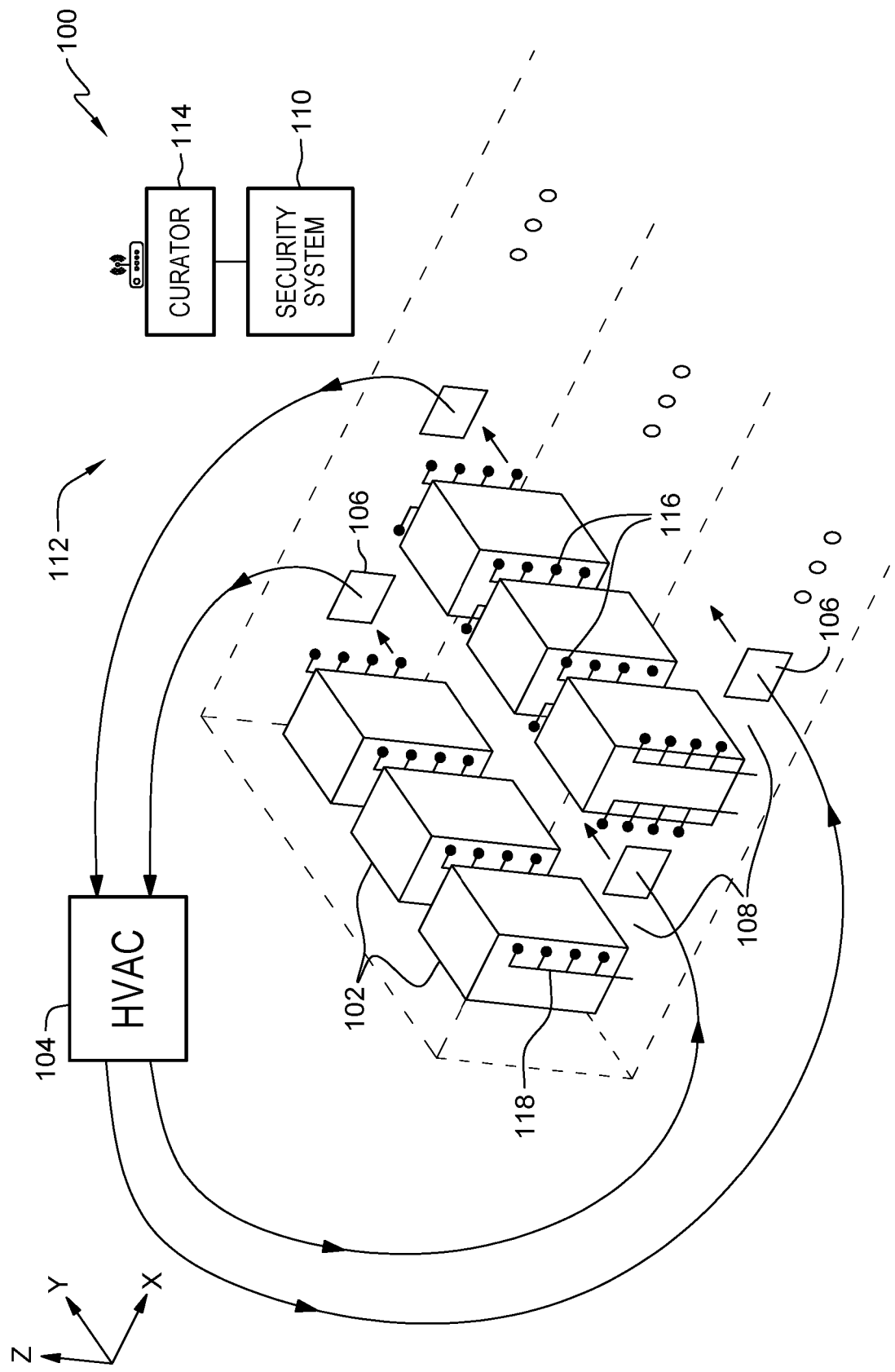
FIG. 1 is a perspective view of a data center, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains," or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on," or "positioned atop" mean that a first element, such as a first structure, is present on a second element, such as a second structure, wherein intervening elements such as an interface structure can be present between the first element and the second element.

Figure 2:
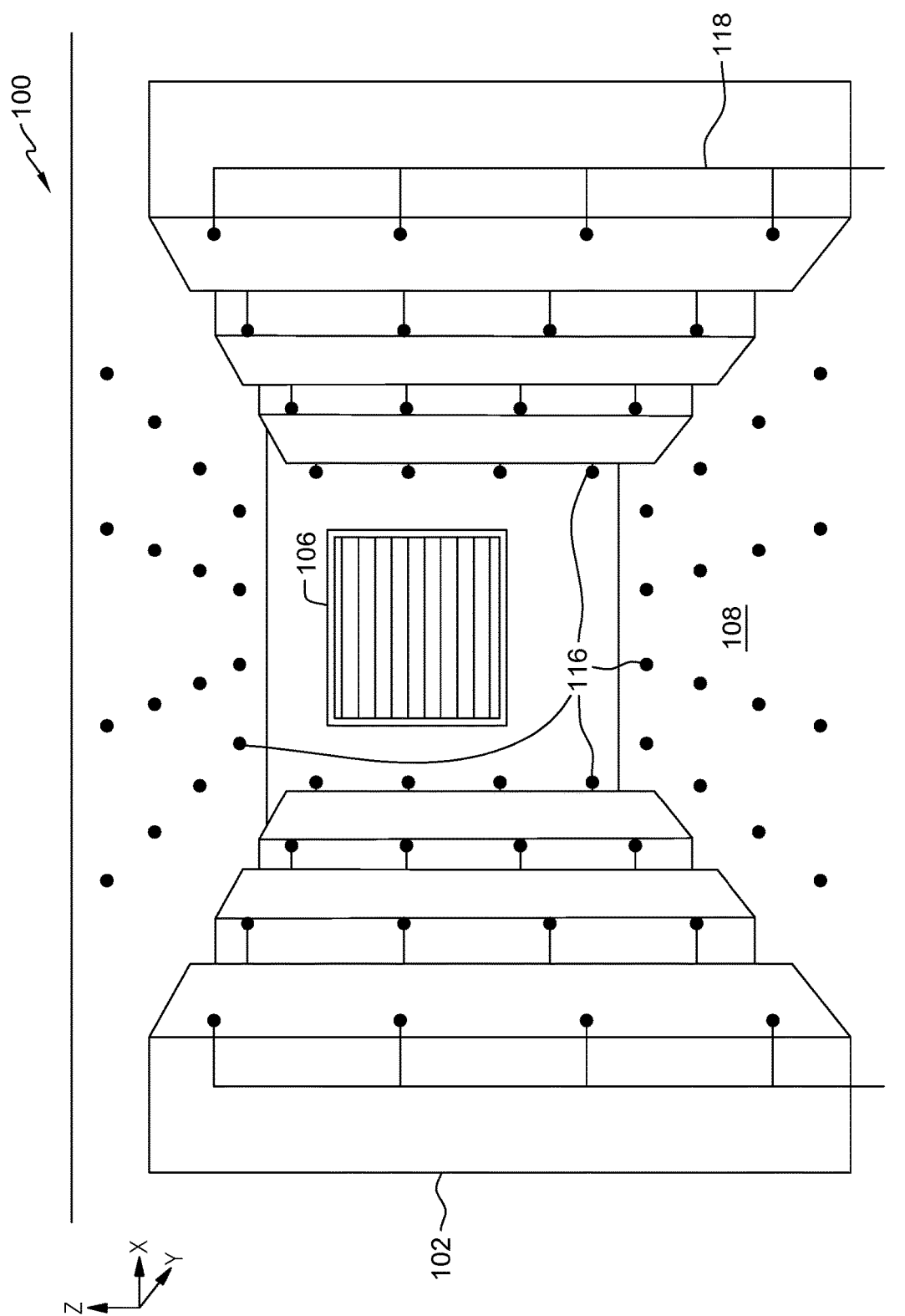
FIG. 2 is a perspective view down an aisle of the data center, in accordance with an embodiment of the present disclosure.

FIG. 1 is a perspective view of data center 100. FIG. 2 is a perspective view down aisle 108 of data center 100. FIGS. 1 and 2 will now be discussed in conjunction with one another.

In the illustrated embodiment, data center 100 is an enclosed space, such as an interior room inside a building, where there is a relatively small number of people entering, exiting, and occupying the space. Data center 100 includes a plurality of server racks 102, heating, ventilation, and air conditioning (HVAC) system 104, and HVAC ducts 106. Server racks 102 are arranged in rows across data center 100 and are separated by aisles 108. Some of ducts 106 are positioned to deliver air from HVAC system 104 from one side of data center 100 and down aisles 108. This air can heat and/or cool server racks 102, and then it is returned to HVAC system 104 via some of ducts 106 that are positioned on the other side of data center 100. Such a configuration can provide an environment with steady-state airflow(s) that can be measured and relied upon. While data center 100 is shown as the exemplary enclosed space, the present disclosure can be applied in other enclosed spaces with forced airflow, such as a bank vault.

In the illustrated embodiment, data center 100 further includes security system 110 to control access to and monitor conditions inside data center 100. Security system 110 can be a security information and event management (SIEM) system, such as, for example, IBM® QRadar®. Security system 110 is communicatively connected to object detection system (ODS) 112, which is a system that can detect and track objects inside data center 100. ODS 112 includes curator 114 and a plurality of anemometers 116. Anemometers 116 are spaced throughout data center 100, with some of anemometers 116 being connected to poles 118, while other anemometers 116 are connected to the walls, to server racks 102, on or below the floor, or on or above the ceiling of data center 100. Curator 114 includes an address database that correlates each anemometer 116 with a three-dimensional (X, Y, Z) coordinate position in data center 100. Some or all of anemometers 116 can have an inconspicuous appearance and/or be concealed to inhibit detection by people inside data center 100.

In the illustrated embodiment, each anemometer 116 is communicatively connected to curator 114, for example, via a wireless connection such as, for example, Long Range (LoRa®) or Sigfox™ communications in a low-power wide-area network (LPWAN). Such communications can be formatted according to a variety of protocols, such as, for example, DASH7 Alliance Protocol (D7A) or LoRaWAN®. Each anemometer 116 can measure the speed and/or direction of local airflow in real-time, and the measurements therefrom can be sent to curator 114. In some embodiments, the airflow is solely originating from some of ducts 106, but in other embodiments, at least some of the airflow originates from poles 118 (i.e., each pole 118 is a duct that provides airflow past each anemometer 116, respectively). In addition, each anemometer 116 can include its own battery (not shown), which can be charged by extracting energy from the airflow in data center 100. Thereby, curator 114 can monitor airflow throughout data center 100 and check for anomalies that may indicate the presence of an object (such as a person or a piece of equipment). This information can be forwarded to security system 110, which can then choose whether to sound an alarm, and if so, determine what severity of alarm should be indicated. This decision can be influenced by other information that security system 110 has, such as, for example, whether a door or window in the data center is open or the current number of people that are authorized to be in data center 100.

Figure 3:
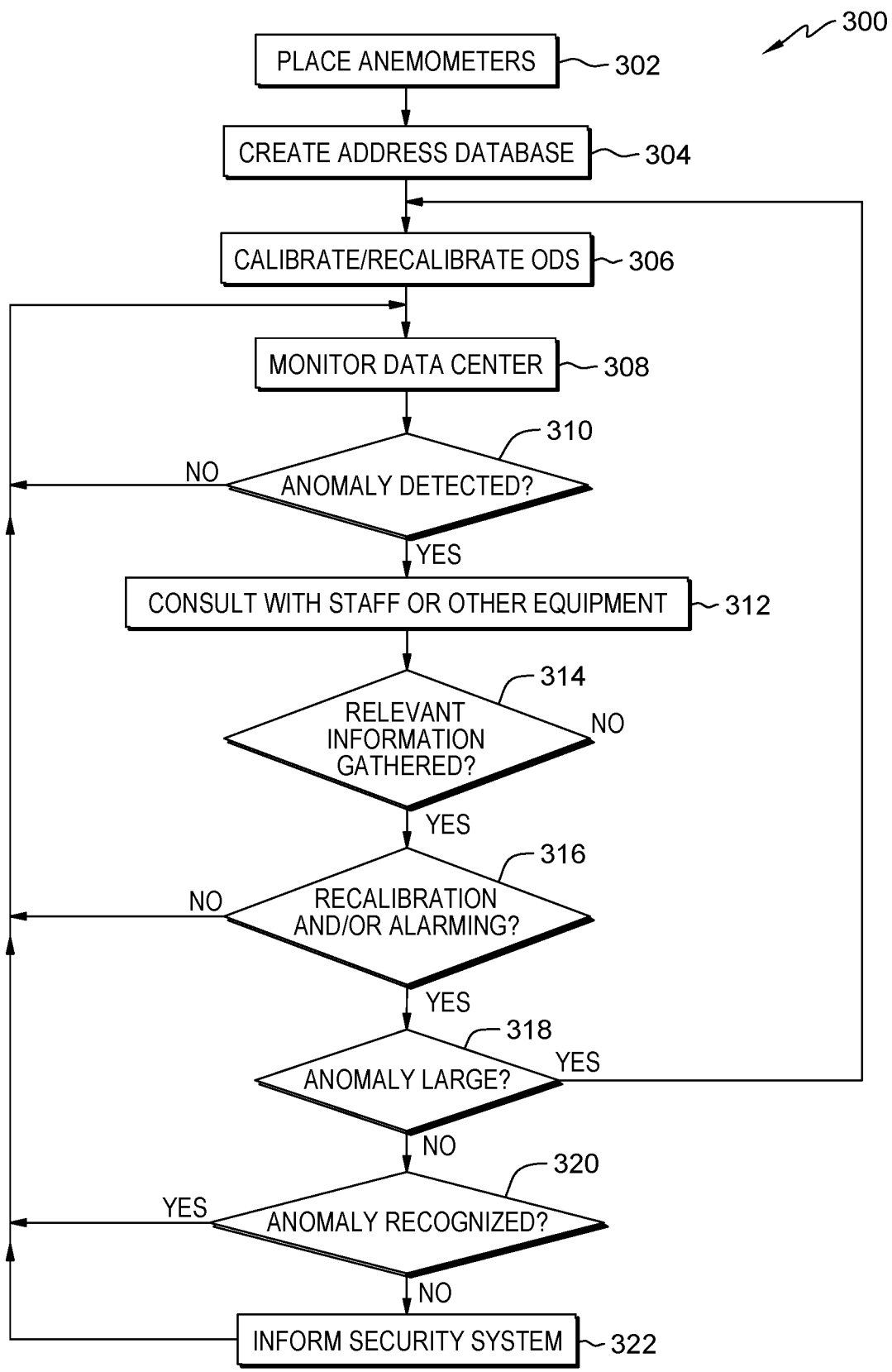
FIG. 3 is a method of initializing, recalibrating, and detecting objects in the data center, in accordance with an embodiment of the present disclosure.

FIG. 3 shows method 300 of initializing, recalibrating, and detecting objects in data center 100. During the discussion of method 300, some of the features shown in FIGS. 1 and 2 will be included using their respective reference numerals. In the illustrated embodiment, at operation 302, anemometers 116 (and poles 118) are placed in data center 100 and communicatively connected to curator 114. At operation 304, curator 114 creates the address database using positional data for each anemometer 116 from, for example, the installer of the anemometers.

In the illustrated embodiment, at operation 306, ODS 112 is calibrated. Operation 306 can include putting data center 100 in a steady state condition for a period of time. Such a steady state can include holding the HVAC system 104 at a known steady state and excluding people from data center 100. During operation 306, curator 114 can collect data from anemometers 116 until there is a sufficient amount of information collected to develop a profile for what the airflow in data center 100 should look like when server racks 102 are installed, but no people are present. Such a profile can be comprised of an average value and/or an operational range of values for each anemometer 116. Such a profile can include other information such as, for example, HVAC parameters, day, date, month, and/or current weather data (e.g., outside temperature, wind, precipitation, humidity, etc.). This information can be used to create and store multiple different baseline profiles for different conditions. For example, the airflow in data center 100 can have different characteristics when HVAC system 104 is heating data center 100 compared to when HVAC system 104 is cooling data center 100 despite the same equipment layout and lack of people being present in data center 100.

During operation 308, data center 100 is monitored by ODS 112 using an appropriate airflow profile. In some embodiments, a tolerance level is used when analyzing the airflow values for each anemometer 116 and/or for the array of anemometers 116 as a whole. For example, a 20% or 30% deviation from expected airflow can be deemed acceptable in operation 310. If an anomaly in the airflow in data center 100 is not found in operation 310, then data center 100 is continued to be monitored at operation 308. If an anomaly is found in operation 310, then method 300 advances to operation 312 where ODS 112 consults with staff (e.g., via a computer interface) or other equipment associated with data center 100 (e.g., HVAC system 104, security system 110, etc. via electronic machine communication). This consultation operation can allow ODS 112 to gather information about why the anomaly may have taken place. At operation 314, it is determined whether relevant information has been gathered in operation 312. If so, then method 300 advances to operation 316, but if not, then method 300 advances to operation 318.

There can be several types of relevant information that can be gathered at operation 312 and used in operation 316 for determining whether recalibration and/or alarming are appropriate. While alarming would alert security system 110 of a potential intrusion into data center 100, recalibration would create a new airflow profile for use in monitoring data center 100. In general, recalibration can be appropriate when the airflow conditions in data center 100 will be different for an extended period of time (e.g., more than five minutes, more than an hour, more than a year, permanently, etc.) in a predictable and permitted manner. For example, if security system 110 informs ODS 112 that a door to data center 100 has been opened, then ODS 112 may ignore the airflow data near the door (or all of the airflow data) for as long as the door is opened (or for a predetermined amount of time (e.g., thirty seconds), or for a predetermined amount of time after the door has been closed (e.g., five seconds)). In such a situation, recalibration and/or alarming would not be appropriate because the anomaly would not last long and using the assumption that if the door was improperly opened, then security system 110 would originate an alarm instead of ODS 112. For another example, if HVAC system 104 informs ODS 112 that the fan speed has changed, then curator 114 can switch the profile that it is using to analyze the airflow measurements to a more appropriate profile. In such a situation, recalibration and/or alarming would be appropriate. For yet another example, ODS 112 can be connected to weather information (e.g., using the Internet), and if ODS 112 receives a notification of a significant change in weather, then curator 114 can switch the profile to a more appropriate profile. In such a situation, recalibration and/or alarming would be appropriate. For yet another example, ODS 112 can prompt a response from security staff as to whether HVAC system 104 has been altered or had maintenance performed. In such a situation, recalibration and/or alarming would be appropriate. For yet another example, ODS 112 can prompt a response from security staff as to whether new equipment has been installed in data center 100 since that could change the baseline airflow in at least a portion of data center 100. In such a situation, recalibration and/or alarming would be appropriate. Similarly, ODS 112 can prompt a response from security staff as to the number of permitted people can be in data center 100 at a given time to determine whether the anomalies are expected or not. In the former such situation, recalibration would not be appropriate, but in the latter a situation, recalibration and/or alarming would be appropriate.

Then, method 300 advances to operation 318, wherein the size of the anomaly is determined. Operation 318 can be performed, for example, by analyzing changes in the readings of anemometers 116. If any of the measurements of anemometers 116 have changed significantly, especially in separate areas of data center 100, that can indicate that there is a change in overall conditions and/or configuration of data center 100. If there is an overall change in data center 100, then recalibration of ODS 112 can occur at operation 306 to prevent a false alarm from being raised. If only a concentrated and/or a small number of anemometers 116 show different readings, that can indicate that an object (e.g., a person or a piece of equipment) is present in data center 100 that was not there before. This can be especially true if the affected anemometers 116 are in an area the corresponds to the size of a person.

Operation 320 determines if the anomaly is recognized by curator 114 as something other than an object (e.g., an intruder). This can be true if, for example, the new airflow pattern a substantially similar to a previously existing profile. If so, then curator 114 can switch to that profile, and monitoring can resume at operation 308. If not, then security system 110 can be alerted to the presence of an unidentified, potentially unpermitted object present in data center 100 at operation 322. In situations where only a single anemometer 116 experiences an anomaly, the alert can indicate a potential hardware/communication fault related to that specific anemometer 116. Furthermore, the data from ODS 112 can be saved for reference and analysis in the future.

Figure 4:
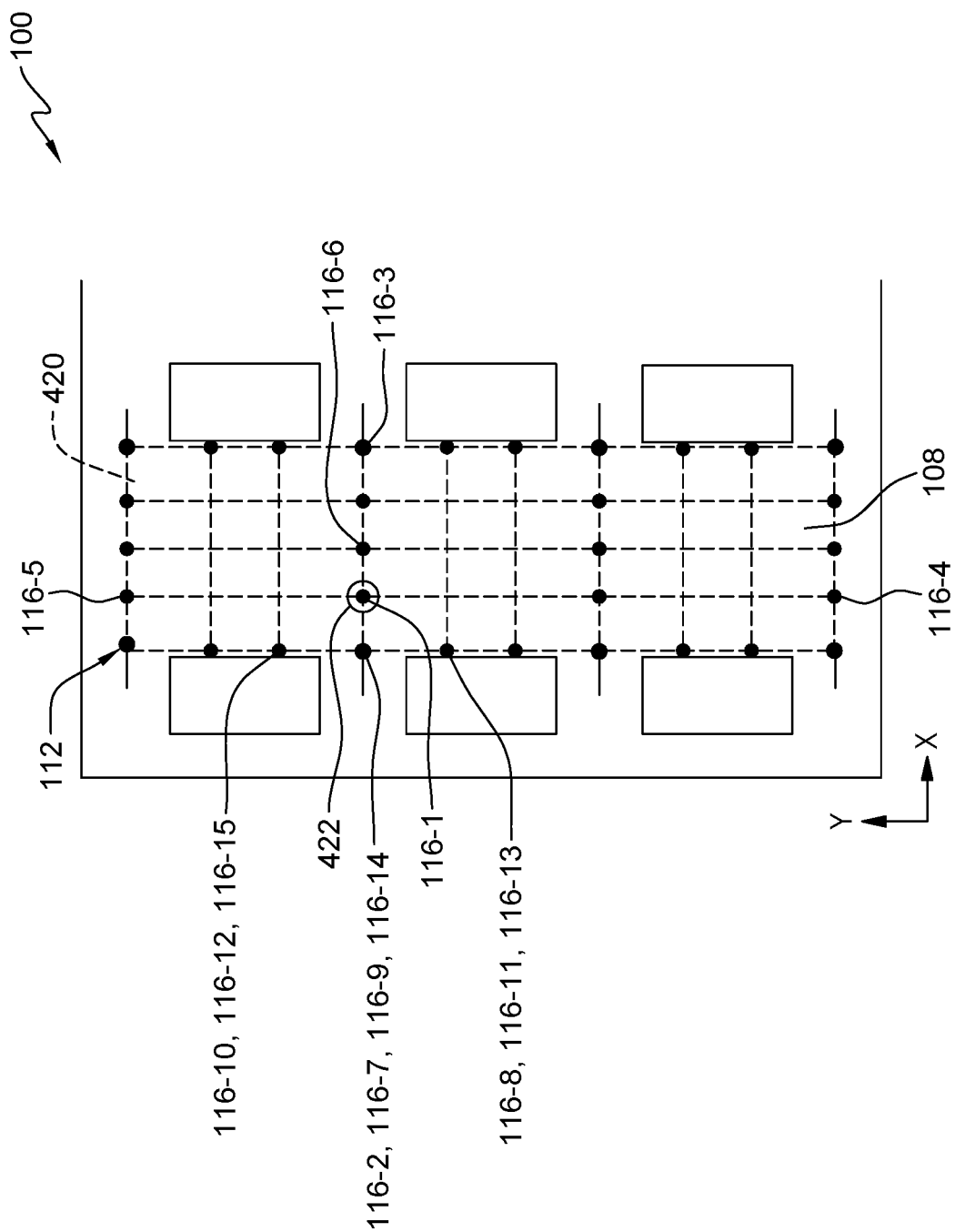
FIG. 4 is a top view of the data center, in accordance with an embodiment of the present disclosure.

FIG. 4 is a top view of data center 100. FIG. 5 is a side view of data center 100. FIGS. 4 and 5 will now be discussed in conjunction with one another.

In the illustrated embodiment, the array of anemometers 116 in ODS 112 constructs a virtual grid 420 of vertices (e.g., vertex 422) in three-dimensional space (shown using the X, Y, and Z axes indicators). These vertices represent distinct monitoring locations throughout data center 100. In some embodiments, the presence of an airflow anomaly at a particular vertex is determined using selected anemometers 116 along virtual grid 420. For example, airflow values from anemometers 116-1 (in the floor), 116-2 (on the left side in FIG. 4), and 116-3 (on the right side in FIG. 4, across from 116-2) can be used to determine whether there is an anomaly at vertex 422, and anemometers 116-4 and 116-5 can also be used given that they are along lines in grid 420 that intersect vertex 422 (despite being relatively distal from vertex 422). The airflow values can be weighted, for example, based on their proximity to vertex 422 to generate an amalgamated value representing the presence or absence of an object at vertex 422.

In some embodiments, the presence of an airflow anomaly at a particular vertex is determined using proximate anemometers 116. For example, airflow values from anemometers 116-1-116-3 and 116-6-116-15. The airflow values can be weighted, for example, based on their proximity to vertex 422, and extra weight may be given to anemometers 116-1-116-3 for being along the lines of grid 420 that intersect vertex 422. In some embodiments, some or all of anemometers 116 can be oriented to sense airflow from a particular direction. In such embodiments, grid 420 may have a non-orthogonal configuration and may even be irregular (i.e., non-uniform spacing between vertices).

In general, the resolution of ODS 112 can be adjusted by increasing or decreasing the granularity of grid 420. This can occur by increasing or decreasing the number of anemometers 116 in data center 100. For example, for a moderate level of granularity, anemometers 116 can be spaced 0.6 meters (m) apart. For another example, for a fine level of granularity, anemometers 116 can be spaced 0.3 m apart. For another example, for a coarse level of granularity, anemometers 116 can be spaced 0.9 m apart.

As stated above, in some embodiments, poles 118 (shown in FIG. 2) are ducts for airflow past their respective anemometers 116. In some embodiments, data center 100 does not include ducts 106 (shown in FIG. 1), but instead, the flow of air from HVAC system 104 (shown in FIG. 1) is expelled from poles 118 on one side of aisle 108 and is collected by poles 118 on the opposite side of aisle 108. In such embodiments, anemometers 116 are paired (e.g., anemometer 116-2 and 116-3) and can function similarly to a laser grid detection system.

Figure 6:
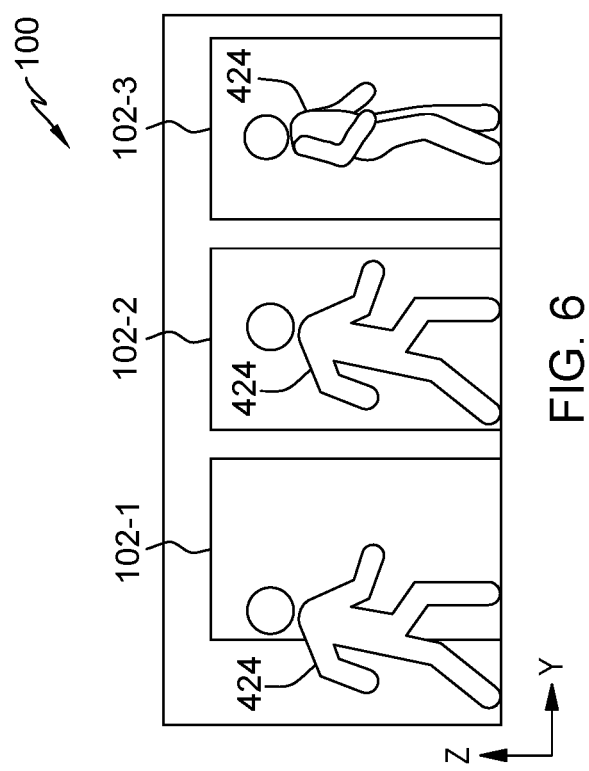
FIG. 6 is a side view of the data center showing a person walking across it, in accordance with an embodiment of the present disclosure.

FIG. 6 is a side view of data center 100 showing person 424 walking across it. In the illustrated embodiment, person 424 moves past server rack 102-1 and 102-2 and then stops in front of server rack 102-3. As discussed previously, the presence of person 424 can be detected by ODS 112 (shown in FIG. 1) due to the airflow anomalies generated by person 424 disturbing the airflow profile in data center 100.

Figure 7:
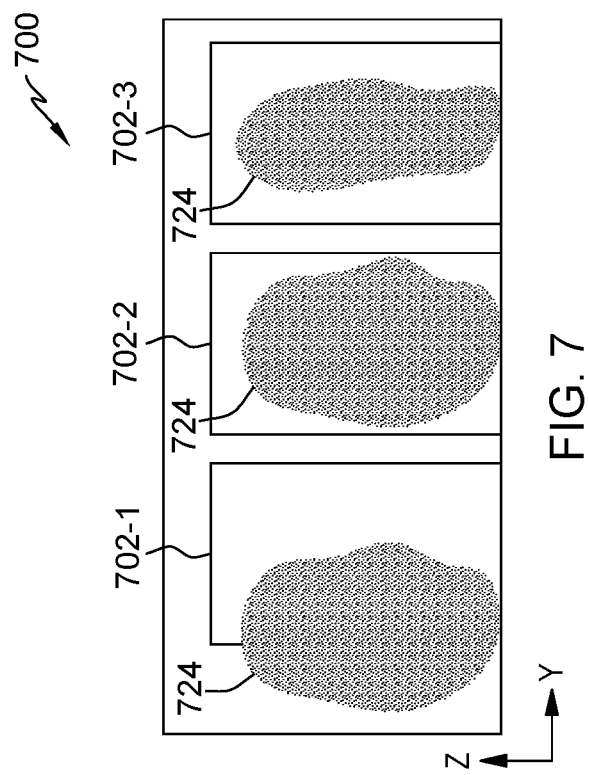
FIG. 7 is a side view of the data center showing a rendering of the detection of the person in FIG. 6, in accordance with an embodiment of the present disclosure.

FIG. 7 is a side view of data center rendering 700 showing rendered object 724 that represents person 424 in FIG. 6. Data center rendering 700 can further include rendered server racks 702-1, 702-2, and 702-3, which can exist in data center rendering 700, for example, by being drawn in by a user. Rendered server racks 702 can provide points of reference for security personnel when reviewing data center rendering 700, for example, on a security monitor screen.

In the illustrated embodiment, rendered object 724 has a somewhat amorphous appearance because the array of anemometers 116 (shown in FIGS. 4 and 5) is not granular enough to provide a detailed shape of person 424 (shown in FIG. 6). Instead, rendered object 724 is a general silhouette having a similar size to person 424. In some embodiments, rendered object 724 is generated using a smoothing algorithm such as, for example, a Bézier curve and/or a NURBS (non-uniform rational B-spline) curve, which can spline the appearance of rendered object 724 if grid 420 (shown in FIGS. 4 and 5) has a relatively small number of vertices.

Rendered object 724 does not have the fine detail of a typical video image in terms of the features of person 424, but rendered object 724 can give security personnel a decent idea of the size and shape of person 424, regardless of whether person 424 is moving or stationary. Furthermore, the lack of visual detail provided by ODS 112 would be advantageous in certain implementations. For example, if an establishment desires security, but clientele would prefer privacy and/or anonymity, ODS 112 could fulfill both requirements.

FIG. 8 is a top view of data center rendering 700 showing rendered path 726 that rendered object 724 has taken since entering data center 100 (shown in FIG. 1). Path 726 can be generated by analyzing airflow measurements over time, which allows for person 424 (shown in FIG. 6) to be tracked through data center 100 (shown in FIG. 1). ODS 112 (shown in FIG. 1) can then process, store, and display this data as data center rendering 700. Because the measurements are analyzed over time, ODS 112 can determine not only the position and size of an object (such as person 424) but also its velocity and direction (a.k.a., their movement vector).

The size, position, velocity, and direction can also be used to assist in identifying what an object is, for example, using curator 114 (shown in FIG. 1). It can also be used to track multiple objects in data center 100, for example, in case two objects pass by each other. In addition, path 726 can be stored along with its corresponding time data for record keeping purposes.

Figure 9:
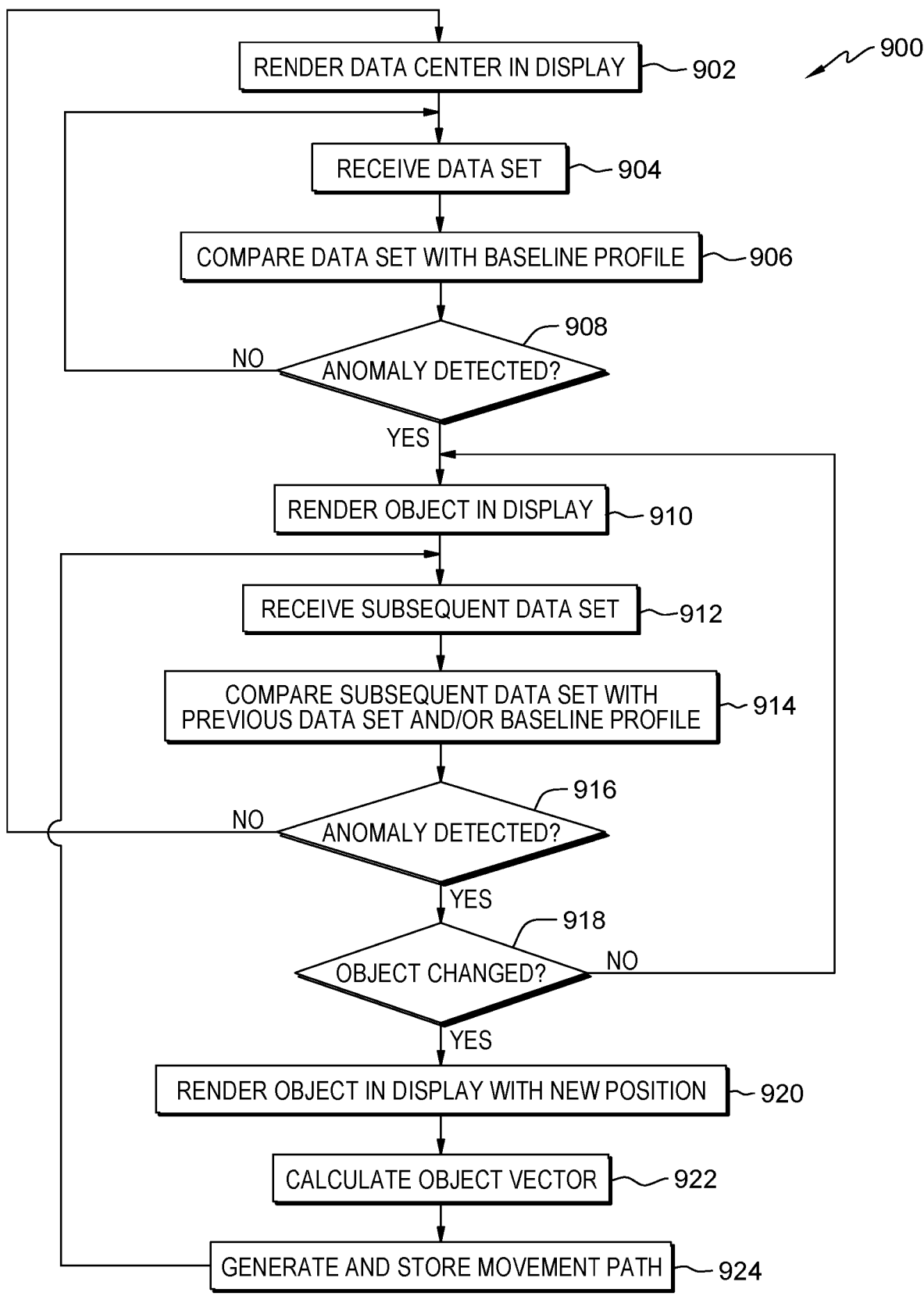
FIG. 9 is a method of tracking an object and rendering the object in a display, in accordance with an embodiment of the present disclosure.

FIG. 9 shows method 900 of tracking an object and rendering a representation of object 424 in a display. During the discussion of method 900, some of the features shown in FIGS. 1-8 will be included using their respective reference numerals. In the illustrated embodiment, in operation 902, data center 100 is rendered as data center rendering 700. At operation 904, an airflow data set is received by curator 114. At operation 906, the airflow data set is compared to the baseline profile of the expected airflow data to determine if any of the measurements are different. Whether there is an anomaly present or not is determined at operation 908. If not, then method 900 returns to operation 904. If so, then method 900 advances to operation 910. In operation 910, the anomalies are analyzed to determine the size and shape of object 424 in data center 100, and rendered object 724 is displayed in data center rendering 700 to represent object 424.

At operation 912, a subsequent airflow data set is received by curator 114. At operation 914, the new airflow data set is compared to the previous airflow data set and/or to the baseline profile to determine if any of the measurements are different. Whether there is still an anomaly present or not is determined at operation 916. If not, then method 900 returns to operation 902 and ceases displaying object 424. If so, then method 900 advances to operation 918. In operation 918, the anomalies are analyzed to determine whether the size and/or shape of object 424 has changed. If not, then method 900 returns to operation 910. If so, then method 900 advances to operation 920. In operation 920, rendered object 724 is rerendered and displayed with the new position as well as a new size and/or shape, if appropriate. In operation 922, an object vector is calculated for the speed and direction of movement of object 424. In operation 924, rendered path 726 is generated and stored, and curator 114 awaits receipt of another airflow data set at operation 912.

Figure 10:
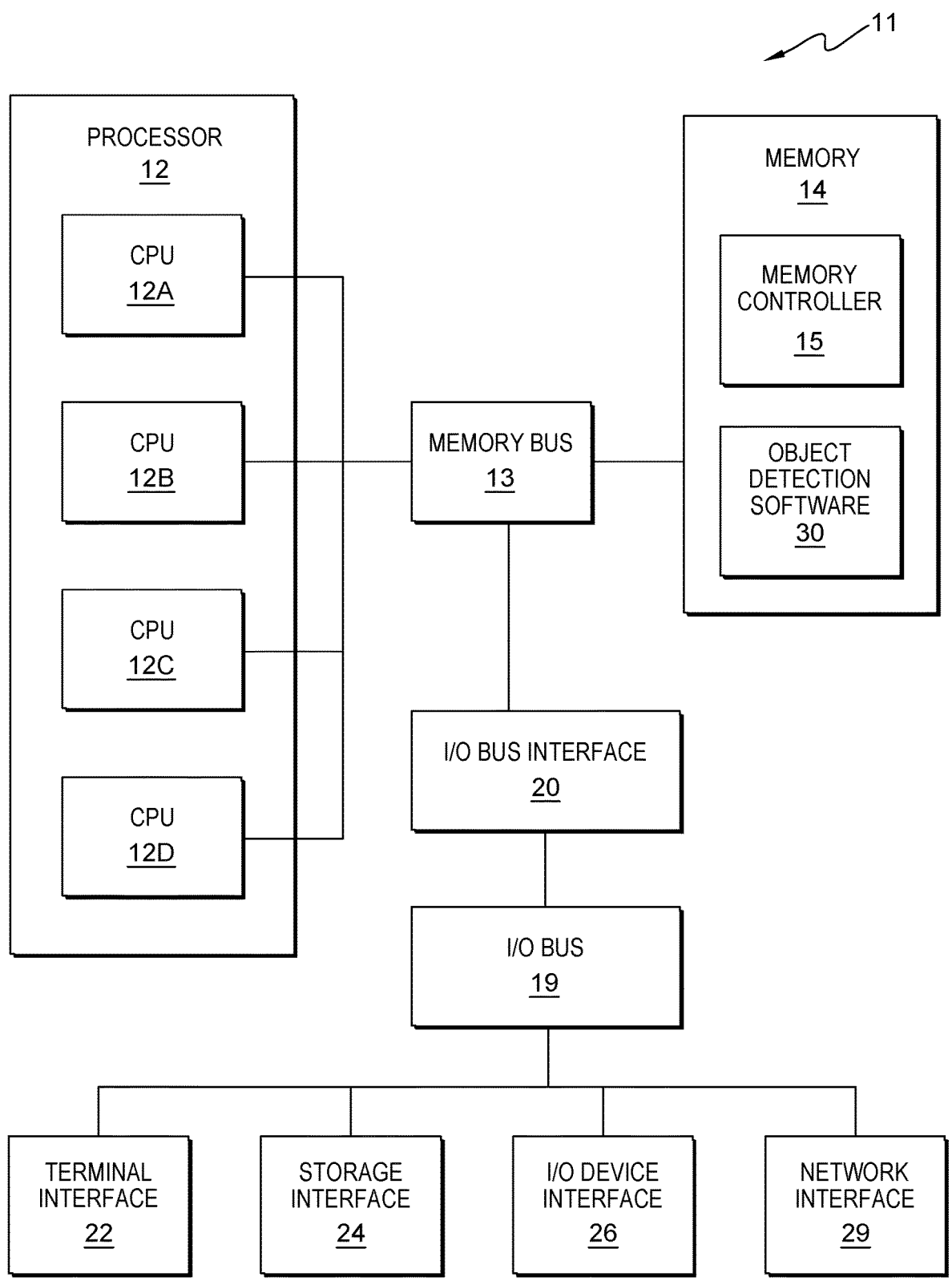
FIG. 10 shows a high-level block diagram of an example computer system that can be used in implementing embodiments of the present disclosure.

Referring now to FIG. 10, shown is a high-level block diagram of an example computer system (i.e., computer) 11 that may be used in implementing one or more of the methods or modules, and any related functions or operations, described herein (e.g., using one or more processor circuits or computer processors of the computer), in accordance with embodiments of the present disclosure. For example, computer system 11 can be used for curator 114 (shown in FIG. 1). In some embodiments, the components of the computer system 11 may comprise one or more CPUs 12, a memory subsystem 14, a terminal interface 22, a storage interface 24, an I/O (Input/Output) device interface 26, and a network interface 29, all of which may be communicatively coupled, directly or indirectly, for inter-component communication via a memory bus 13, an I/O bus 19, and an I/O bus interface unit 20.

The computer system 11 may contain one or more general-purpose programmable central processing units (CPUs) 12A, 12B, 12C, and 12D, herein generically referred to as the processor 12. In some embodiments, the computer system 11 may contain multiple processors typical of a relatively large system; however, in other embodiments, the computer system 11 may alternatively be a single CPU system. Each CPU 12 may execute instructions stored in the memory subsystem 14 and may comprise one or more levels of on-board cache.

In some embodiments, the memory subsystem 14 may comprise a random-access semiconductor memory, storage device, or storage medium (either volatile or non-volatile) for storing data and programs. In some embodiments, the memory subsystem 14 may represent the entire virtual memory of the computer system 11 and may also include the virtual memory of other computer systems coupled to the computer system 11 or connected via a network. The memory subsystem 14 may be conceptually a single monolithic entity, but, in some embodiments, the memory subsystem 14 may be a more complex arrangement, such as a hierarchy of caches and other memory devices. For example, memory may exist in multiple levels of caches, and these caches may be further divided by function so that one cache holds instructions while another holds non-instruction data, which is used by the processor or processors. Memory may be further distributed and associated with different CPUs or sets of CPUs, as is known in any of various so-called non-uniform memory access (NUMA) computer architectures. In some embodiments, the main memory or memory subsystem 14 may contain elements for control and flow of memory used by the processor 12. This may include a memory controller 15.

Although the memory bus 13 is shown in FIG. 10 as a single bus structure providing a direct communication path among the CPUs 12, the memory subsystem 14, and the I/O bus interface 20, the memory bus 13 may, in some embodiments, comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 20 and the I/O bus 19 are shown as single respective units, the computer system 11 may, in some embodiments, contain multiple I/O bus interface units 20, multiple I/O buses 19, or both. Further, while multiple I/O interface units are shown, which separate the I/O bus 19 from various communications paths running to the various I/O devices, in other embodiments, some or all of the I/O devices may be connected directly to one or more system I/O buses.

In some embodiments, the computer system 11 may be a multi-user mainframe computer system, a single-user system, or a server computer or similar device that has little or no direct user interface but receives requests from other computer systems (clients). Further, in some embodiments, the computer system 11 may be implemented as a desktop computer, portable computer, laptop or notebook computer, tablet computer, pocket computer, telephone, smart phone, mobile device, or any other appropriate type of electronic device.

In the illustrated embodiment, memory subsystem 14 further includes object detection software 30. The execution of object detection software 30 (for example, using an execution module) enables computer system 11 to perform one or more of the functions described above, for example, to detect and track objects and communicate with other equipment and staff.

It is noted that FIG. 10 is intended to depict representative components of an exemplary computer system 11. In some embodiments, however, individual components may have greater or lesser complexity than as represented in FIG. 10, components other than or in addition to those shown in FIG. 10 may be present, and the number, type, and configuration of such components may vary.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 11:
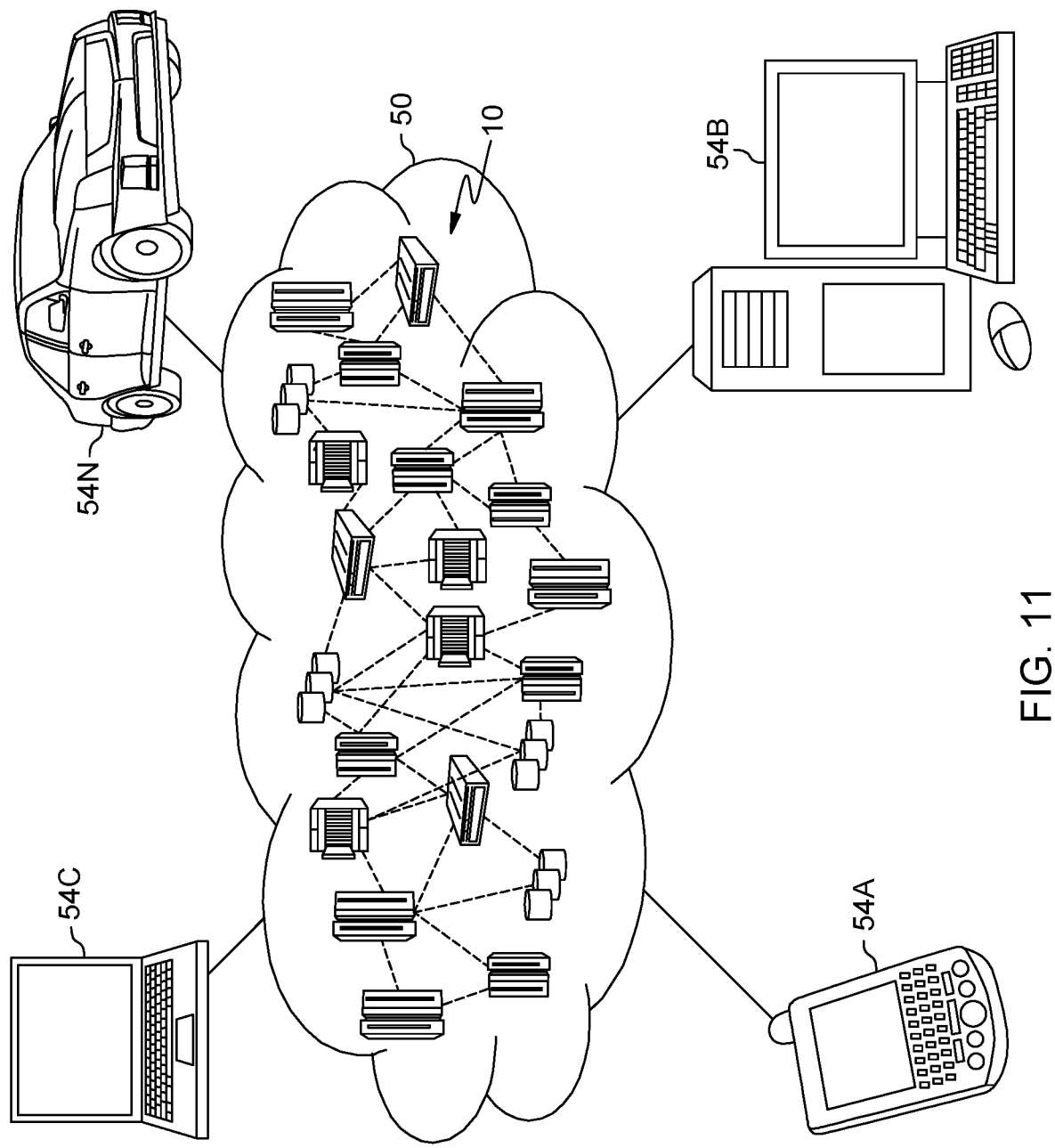
FIG. 11 shows a cloud computing environment, in accordance with an embodiment of the present disclosure.

Referring now to FIG. 11, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 11 are intended to be illustrative only and that computing nodes 10 and cloud computing environment 50 can communicate with any type of computerized device over any type of network and/or network addressable connection (e.g., using a web browser).

Figure 12:
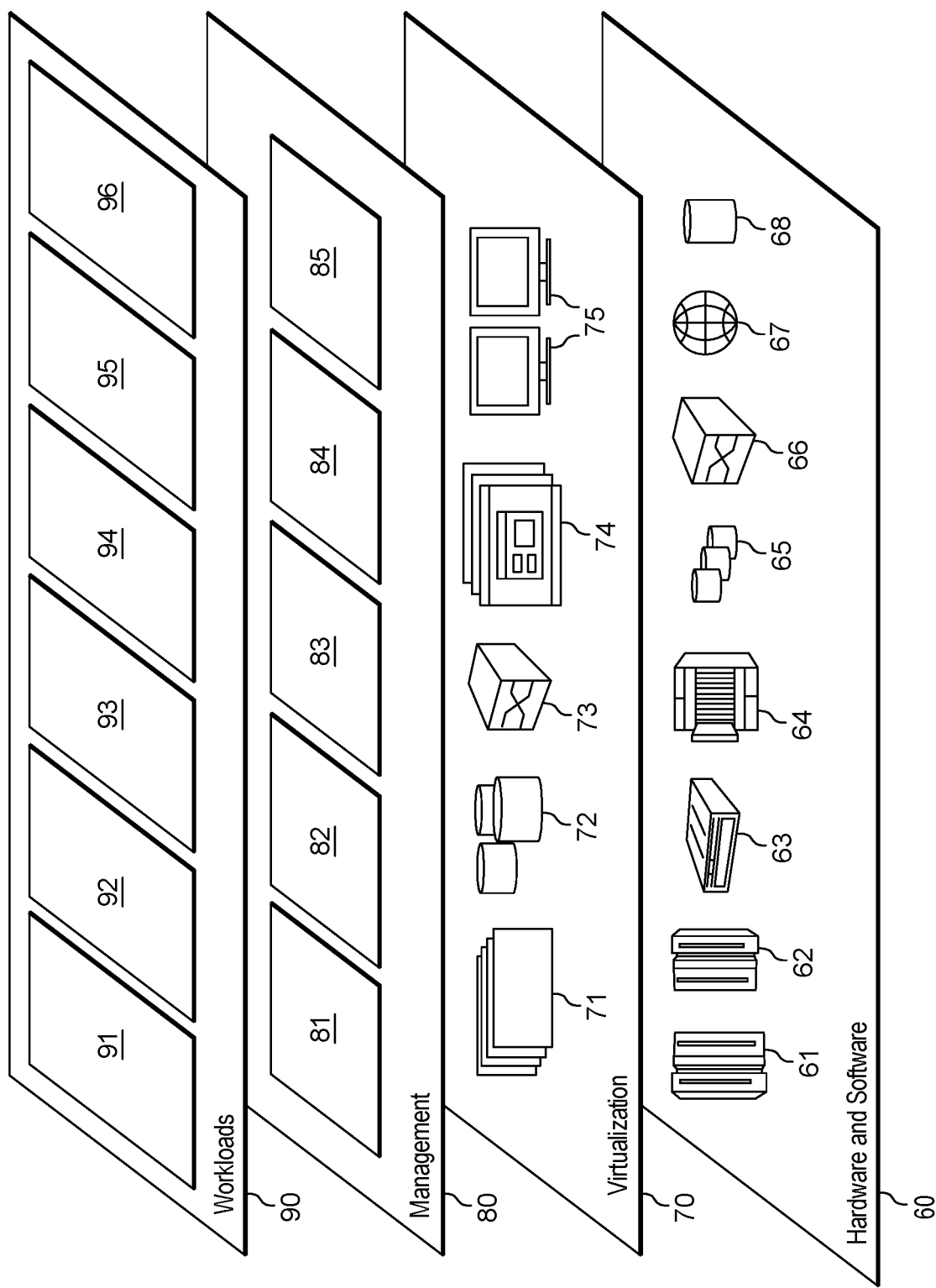
FIG. 12 shows abstraction model layers, in accordance with an embodiment of the present disclosure.

Referring now to FIG. 12, a set of functional abstraction layers provided by cloud computing environment 50 (FIG. 11) is shown. It should be understood in advance that the components, layers, and functions shown in FIG. 12 are intended to be illustrative only and embodiments of the invention are not limited thereto. s depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and object detection system module 96.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for detecting an object within a space, the computer-implemented method comprising:
   receiving, by a computer communicatively connected to a plurality of anemometers positioned throughout the space, first sensor data from the plurality of anemometers;
   creating a baseline profile of airflow in the space based on the first sensor data;
   receiving second sensor data from the plurality of anemometers at a different time than the first sensor data;
   comparing the second sensor data with the first sensor data to determine first different data;
   rendering, in response to determining that the second sensor data is different from the first sensor data, a representation of the object using the first different data and first location data related to the first different data; and
   calculating a vector associated with the object using the first different data and the first location data.

2. The computer-implemented method of claim 1, wherein calculating the vector further comprises:
   receiving third sensor data from the plurality of anemometers;
   comparing the third sensor data with the second sensor data to determine second different data; and
   rerendering the representation using the second different data and second location data related to the second different data.

3. The computer-implemented method of claim 1, wherein the first location data comprises three-dimensional information that indicates locations in the space that each of the first different data represents.

4. The computer-implemented method of claim 1, further comprising:
   receiving, by the computer, address data comprising three-dimensional information that indicates locations of each of the plurality of anemometers.

5. The computer-implemented method of claim 4, further comprising:
   constructing a virtual grid of vertices representing locations in the space between each of the plurality of anemometers using the address data.

6. The computer-implemented method of claim 5, wherein each vertex in the virtual grid represents an amalgamation of weighted sensor data from one or more of the plurality of anemometers.

7. The computer-implemented method of claim 1, wherein the different data represents interruptions in the baseline profile of airflow in the space.

8. A system for detecting an object in a space, the system comprising:
   a plurality of anemometers positioned throughout the space;
   a computer communicatively connected to the plurality of anemometers, the computer including a processor configured to:
   receive first sensor data from the plurality of anemometers;
   create a baseline profile of airflow in the space based on the first sensor data;
   receive second sensor data from the plurality of anemometers at a different time than the first sensor data;
   compare the second sensor data with the first sensor data to determine first different data;
   render, in response to determining that the second sensor data is different from the first sensor data, a representation of the object using the first different data and first location data related to the first different data; and
   calculate a vector associated with the object using the first different data and the first location data.

9. The system of claim 8, wherein calculating the vector further includes the processor being configured to:
   receive third sensor data from the plurality of anemometers;
   compare the third sensor data with the second sensor data to determine second different data; and rerender the representation using the second different data and second location data related to the second different data.

10. The system of claim 8, wherein the first location data comprises three-dimensional information that indicates locations in the space that each of the first different data represents.

11. The system of claim 8, wherein the processor is further configured to:
receive address data comprising three-dimensional information that indicates locations of each of the plurality of anemometers.

12. The system of claim 11, wherein the processor is further configured to:
construct a virtual grid of vertices representing locations in the space between each of the plurality of anemometers using the address data.

13. The system of claim 12, wherein each vertex in the virtual grid represents an amalgamation of weighted sensor data from one or more of the plurality of anemometers.

14. The system of claim 8, wherein the different data represents interruptions in the baseline profile of airflow in the space.

15. A computer program product for detecting an object in a space, the computer program product comprising a computer readable storage medium having program instructions embodied therewith, the program instructions executable by a processor to cause the processor to:
receive, by a computer communicatively connected to a plurality of anemometers positioned throughout the space, first sensor data from the plurality of anemometers;
create a baseline profile of airflow in the space based on the first sensor data;
receive second sensor data from the plurality of anemometers at a different time than the first sensor data;
compare the second sensor data with the first sensor data to determine first different data;
render, in response to determining that the second sensor data is different from the first sensor data, a representation of the object using the first different data and first location data related to the first different data; and
calculate a vector associated with the object using the first different data and the first location data.

16. The computer program product of claim 15, wherein calculating the vector further includes the processor being configured to:
receive third sensor data from the plurality of anemometers;
compare the third sensor data with the second sensor data to determine second different data; and
rerender the representation using the second different data and second location data related to the second different data.

17. The computer program product of claim 15, wherein the first location data comprises three-dimensional information that indicates locations in the space that each of the first different data represents.

18. The computer program product of claim 15, wherein the processor is further configured to:
receive, by the computer, address data comprising three-dimensional information that indicates locations of each of the plurality of anemometers.

19. The computer program product of claim 18, wherein the processor is further configured to:
construct a virtual grid of vertices representing locations in the space between each of the plurality of anemometers using the address data.

20. The computer program product of claim 19, wherein each vertex in the virtual grid represents an amalgamation of weighted sensor data from one or more of the plurality of anemometers.

* * * * *